(12) United States Patent
Chen et al.

(10) Patent No.: US 7,675,362 B2
(45) Date of Patent: Mar. 9, 2010

(54) SWITCHING AMPLIFIER

(75) Inventors: Fu-Yuan Chen, Kao-Hsiung Hsien (TW); Ming-Hung Chang, Hsin-Chu Hsien (TW); Yueh-Ping Yu, Hualien County (TW)

(73) Assignee: Anpec Electronics Corporation, Hsin-Chu (TW)

( * ) Notice: Subject to any disclaimer, the term of this patent is extended or adjusted under 35 U.S.C. 154(b) by 0 days.

(21) Appl. No.: 12/144,591

(22) Filed: Jun. 23, 2008

(65) Prior Publication Data
US 2009/0160551 A1 Jun. 25, 2009

Related U.S. Application Data

(60) Provisional application No. 61/016,572, filed on Dec. 25, 2007.

(51) Int. Cl.
*H03F 3/217* (2006.01)

(52) U.S. Cl. .................. 330/251; 330/207 A

(58) Field of Classification Search .......... 330/10, 330/207 A, 251
See application file for complete search history.

(56) References Cited

U.S. PATENT DOCUMENTS 7,088,177 B2 * 8/2006 Lind .................. 330/207 A
7,463,090 B2 * 12/2008 Kaiho et al. .............. 330/10

* cited by examiner

*Primary Examiner*—Khanh V Nguyen
(74) *Attorney, Agent, or Firm*—Winston Hsu

(57) ABSTRACT

A switching amplifier includes an input end for receiving an input signal, a reference signal reception end for receiving a reference signal, a feedback end for receiving a feedback signal, an output end for outputting an output signal, an integration circuit for performing integration operation on the input signal according to the output signal and the feedback signal, so as to generate an integration result, a comparison circuit coupled to the integration circuit, the reference signal end, and the output end, for comparing the integration result and the reference signal, so as to generate the output signal for the output end, and a feedback circuit coupled between an output end of the integration circuit and the feedback end, for generating the feedback signal for the feedback end to clamp the integration result to a predetermined value when the integration result reaches the predetermined value.

11 Claims, 6 Drawing Sheets

SWITCHING AMPLIFIER

CROSS REFERENCE TO RELATED APPLICATIONS

This application claims the benefit of U.S. Provisional Application No. 61/016,572, filed on Dec. 25, 2007 and entitled "Clipping Control of a Class D Amplifier", the contents of which are incorporated herein by reference.

BACKGROUND OF THE INVENTION

1. Field of the Invention

The present invention relates to a switching amplifier, and more particularly, to an amplifier for generating compensating current via a feedback circuit to keep stability of a feedback system, thereby responding to the change of input signals immediately to decrease output distortion.

2. Description of the Prior Art

Power amplifiers are utilized for amplifying signal power, and are usually classified into A, B, AB, C and D types. The D type amplifier adopts a Pulse-Width Modulation (PWM) technology, which adjusts duty cycles of square waves to represent input values. When the D type amplifier works, an output-stage transistor of the D type amplifier transforms from extremely high impedance to extremely low impedance. The output-stage power loss of the D type amplifier is less than those of other amplifiers due to a short period in an active region, so that the D type amplifier has higher efficiency and is utilized in an audio output system.

Please refer to FIG. 1. FIG. 1 is a schematic diagram of a D type amplifier 10 in the prior art. The D type amplifier 10 comprises an integrator 100, a comparator 102, and a driving circuit 104. The integrator 100 is a two-order integrator utilized for performing a two-order integration operation on an input signal VI, and comprises operational amplifiers 106, 108, resistors 110, 112, 114, 116, and capacitors 118, 120. The resistors 112, 114, 116 and the capacitors 118, 120 determine a bandwidth of the D type amplifier 10, and the resistors 110, 112 determine the gain of the D type amplifier 10. The comparator 102 is coupled to an output end of the integrator 100 for comparing an output signal of the integrator 100 and a triangle signal 122, and outputs a comparison result to the driving circuit 104. Then, the driving circuit 104 outputs an output signal VO to a load circuit (not shown in FIG. 1) and feedbacks the output signal VO to an input end of the integrator 100 according to the comparison result of the comparator 102.

Please refer to FIG. 2, which illustrates a schematic diagram of related signal waveforms when the D type amplifier 10 shown in FIG. 1 operates. In FIG. 2, $W_{ID}$ represents an ideal waveform of the D type amplifier 10 (after passing a low-pass filter), $W_{VO}$ represents a real output waveform of the D type amplifier 10 (namely, the waveform of the output signal VO), $W_{VIO}$ represents a waveform of an output signal VIO of the integrator 100, $W_{TRI}$ represents a waveform of the triangle signal 122, and $W_{VI2}$ represents a waveform of an input signal VI2 of the operational amplifier 108. Moreover, because of system constraint, VO_max represents the maximum possible value of the output signal VO, and VIO_max represents the maximum possible value of the output signal VIO of the integrator 100. Thus, as shown in FIG. 2, when the output level of the D type amplifier 10 reaches the maximum value VO_max, the output level of the integrator 100 exceeds the triangle signal 122, causing the output of the D type amplifier 10 to be saturated. In such a situation, if the output level of the integrator 100 reaches the maximum VIO_max, a charging current flowing through the capacitor 120 will lower the level of the input signal VI2, causing the operational amplifier 108 to operate in an open loop state. Then, if the system needs to lower the output signal VO, the prior art needs to discharge the charge in the capacitor 120 to recover the state of the operational amplifier 108 back to a close loop state, which wastes extra time. However, the extra discharging time causes the output of the D type amplifier 10 to deviate from the ideal state, and generates distortion for the audio output system.

SUMMARY OF THE INVENTION

It is therefore a primary objective of the claimed invention to provide a switching amplifier.

The present invention discloses a switching amplifier, which comprises an input end for receiving an input signal, a reference signal reception end for receiving a reference signal, a feedback end for receiving a feedback signal, an output end for outputting an output signal, an integration circuit coupled to the input end, the output end, and the feedback end, for performing integration operation on the input signal according to the output signal and the feedback signal, so as to generate an integration result, a comparison circuit coupled to the integration circuit, the reference signal end, and the output end, for comparing the integration result and the reference signal, so as to generate the output signal for the output end, and a feedback circuit coupled between an output end of the integration circuit and the feedback end, for generating the feedback signal for the feedback end to clamp the integration result to a predetermined value when the integration result reaches the predetermined value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
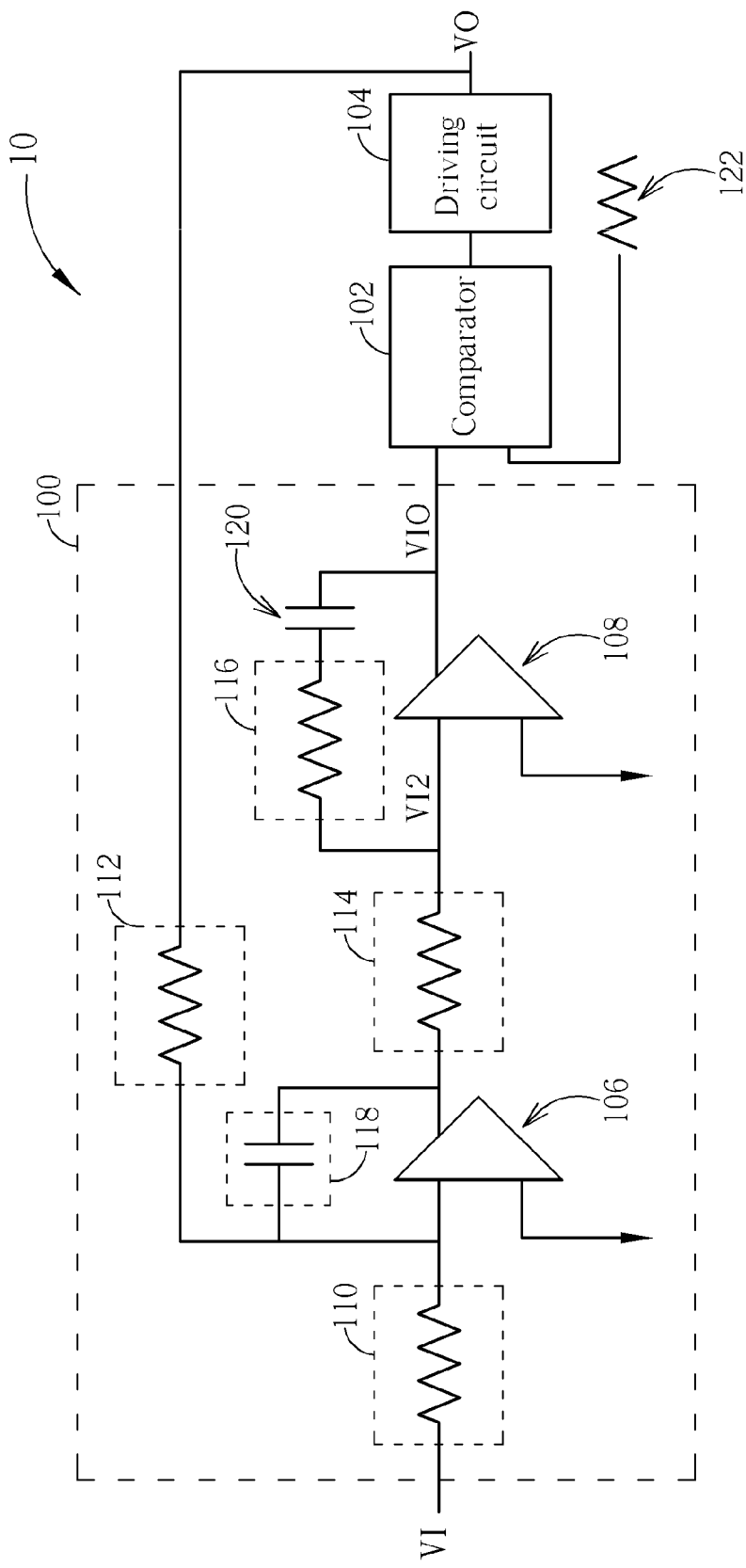
FIG. 1 is a schematic diagram of a D type amplifier in the prior art.
Figure 3:
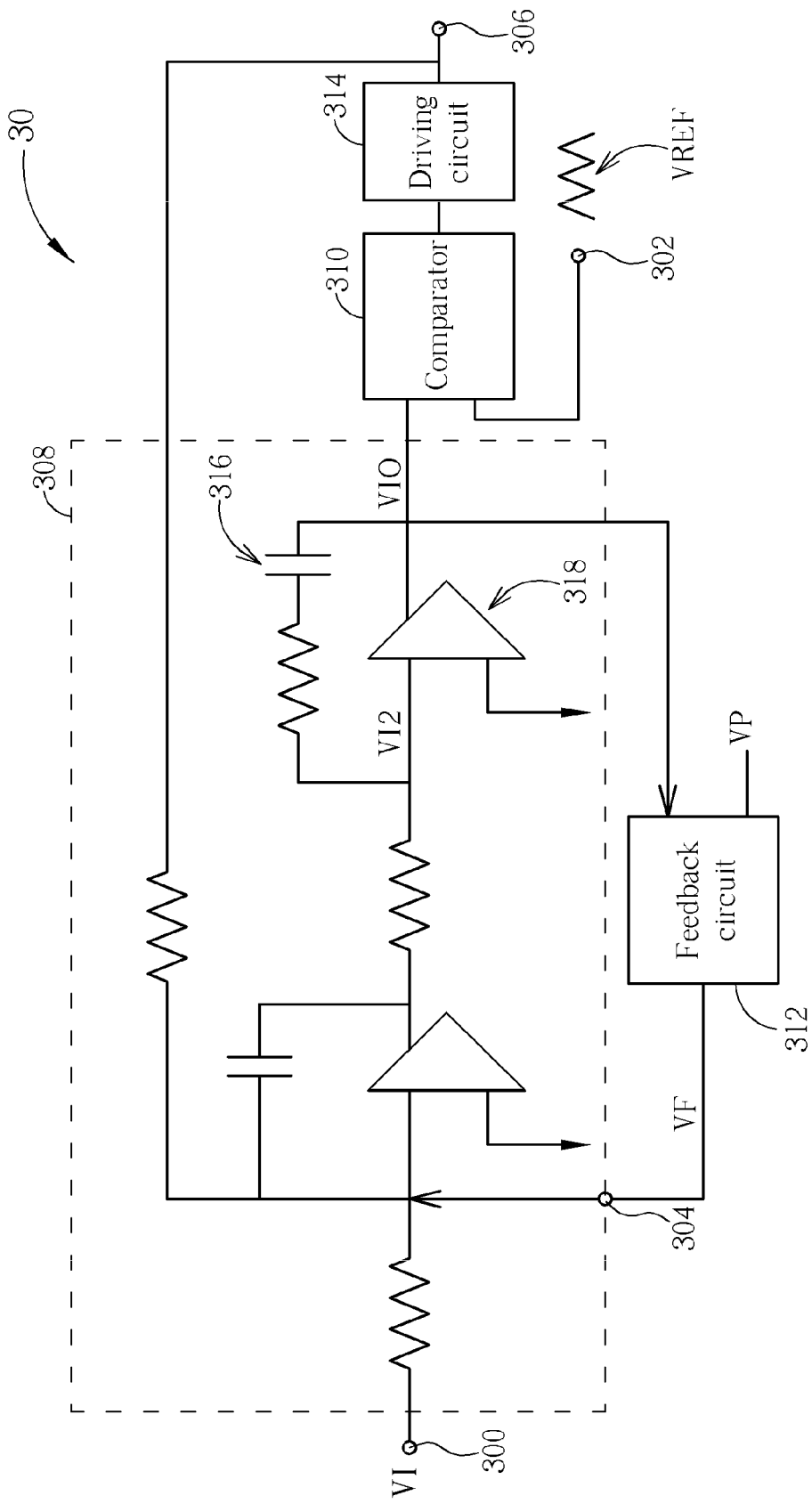
FIG. 3 is a schematic diagram of a switching amplifier capable of reducing output distortion according to an embodiment of the present invention.

Please refer to FIG. 3. FIG. 3 is a schematic diagram of a switching amplifier 30 capable of reducing output distortion according to an embodiment of the present invention. The switching amplifier 30 is a D type amplifier, and comprises an input end 300, a reference signal reception end 302, a feedback end 304, an output end 306, an integration circuit 308, a comparison circuit 310, a feedback circuit 312, and a driving circuit 314. The input end 300 is utilized for receiving an input signal VI. The reference signal reception end 302 is utilized for receiving a reference signal VREF. The feedback end 304 is utilized for receiving a feedback signal VF outputted by the feedback circuit 312, and the output end 306 is utilized for outputting an output signal VO. The structure of the integration circuit 308 is the same as that of the integrator 100 in FIG. 1, and utilized for performing integration operation on the input signal VI according to the output signal VO and the feedback signal VF, so as to generate an integration result VIO. The comparison circuit 310 compares the integration result VIO and the reference signal VREF to generate the output signal VO for the driving circuit 314. Then, the driving circuit 314 outputs the output signal VO via the output end 306. The feedback circuit 312 is utilized for clamping the integration result VIO to a predetermined value VP when the integration result VIO reaches the predetermined value VP. In other words, when the integration result VIO generated by the integration circuit 308 increases to the predetermined value VP (or decreases to the predetermined value VP, depending on the requirement of the system), the feedback circuit 312 generates the feedback signal VF to clamp the integration result VIO to the predetermined value VP. Thus, the feedback signal VF can compensate current flowing to a capacitor 316 of the integration circuit 308, so as to keep an operational amplifier 318 of the integration circuit 308 in the close loop state. Please refer to the description below.

Figure 2:
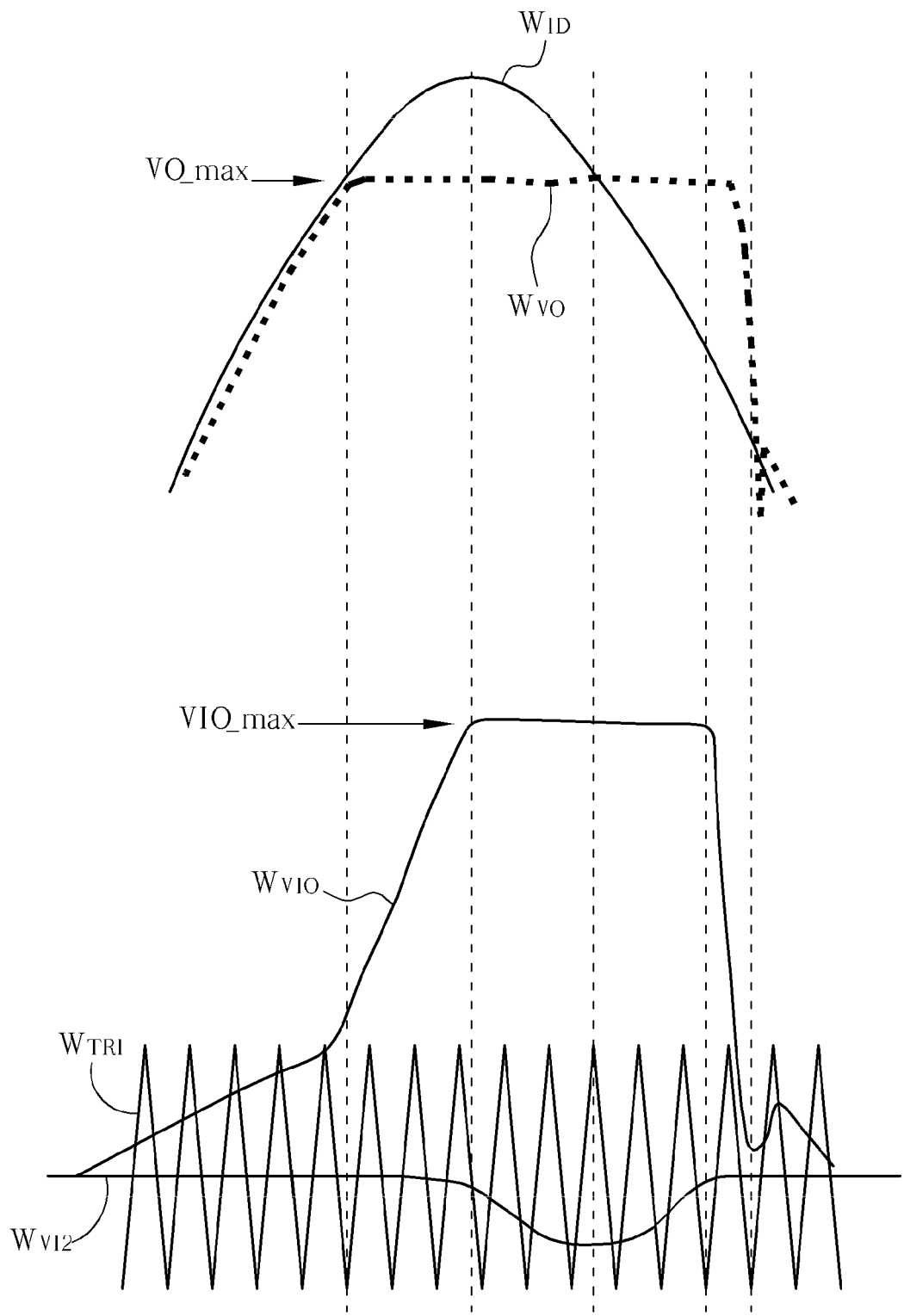
FIG. 2 is a schematic diagram of related signal waveforms when the D type amplifier shown in FIG. 1 operates.
Figure 4:
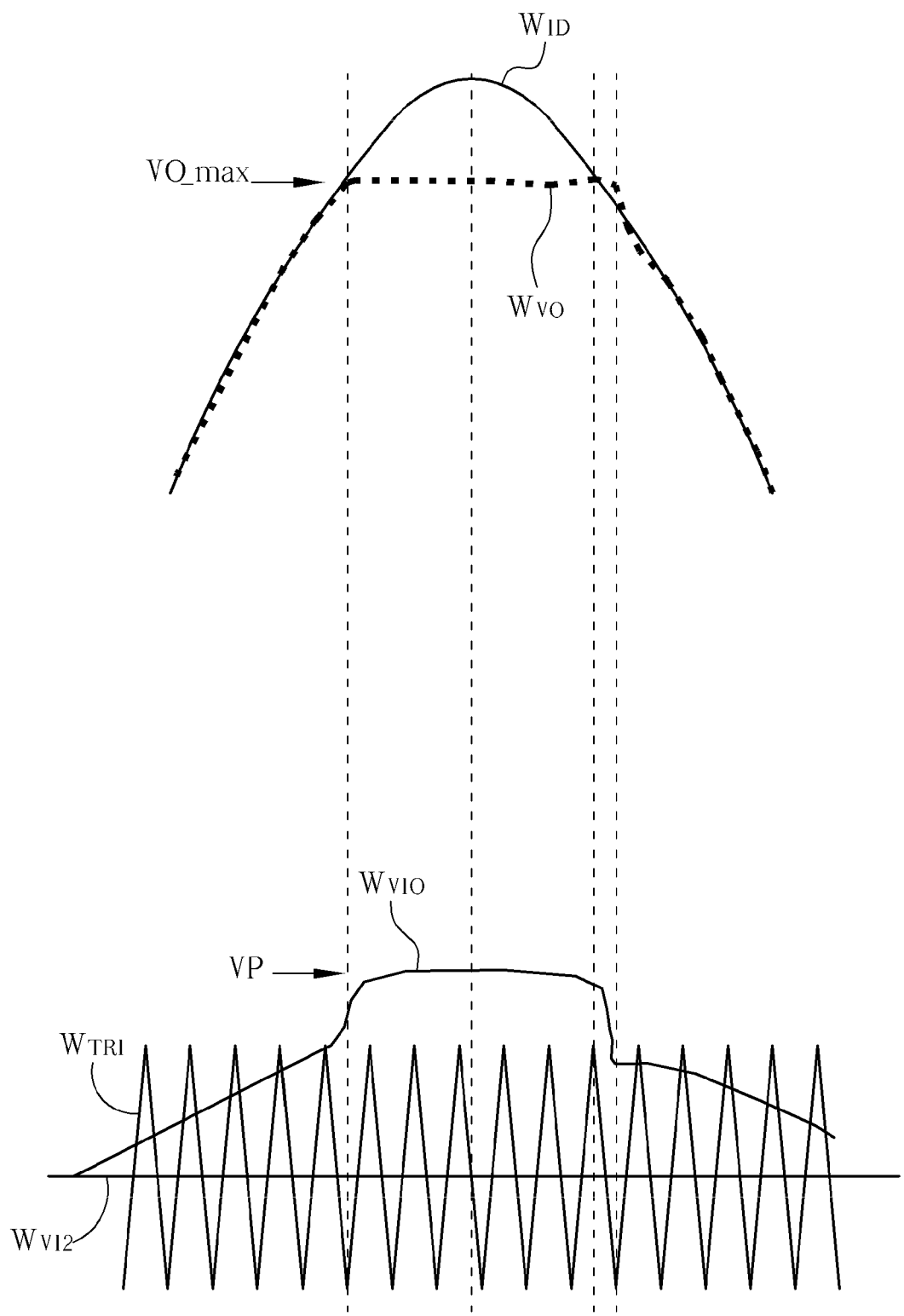
FIG. 4 is a schematic diagram of related signal waveforms when the switching amplifier shown in FIG. 3 operates.

Please refer to FIG. 4. FIG. 4 is a schematic diagram of related signal waveforms when the switching amplifier 30 shown in FIG. 3 operates. In order to clearly compare the present invention and the prior art, symbols shown in FIG. 4 are the same as those in FIG. 2. For example, $W_{ID}$ represents an ideal waveform of the switching amplifier 30, $W_{VO}$ represents an real output waveform of the switching amplifier 30 (namely, the waveform of the output signal VO), $W_{VIO}$ represents a waveform of the integration result VIO, $W_{TRI}$ represents a waveform of the reference signal VREF, $W_{VI2}$ represents a waveform of an input signal VI2 of the operational amplifier 318, and VO_max represents the maximum possible value of the output signal VO. As shown in FIG. 4, when the output level of the integration circuit 308 reaches the predetermined value VP, the feedback circuit 312 generates the feedback signal VF for clamping the integration result VIO to stay in the predetermined value VP. The feedback signal VF can compensate current flowing to the capacitor 316, to make the current to be zero. Since there is no current flowing to the capacitor 316, the voltage across the capacitor 316 can keep unchanged, so as to keep the integration result VIO unchanged. Therefore, the operational amplifier 318 can keep in the close loop state. That is, the input signal VI2 of the operational amplifier 318 keeps unchanged. In such a situation, the operational amplifier 318 don't need to waste extra time to transform from the open loop state to the close loop state. As a result, the switching amplifier 30 can immediately respond to change of the input signal VI to decrease distortion of the output signal VO.

Figure 5:
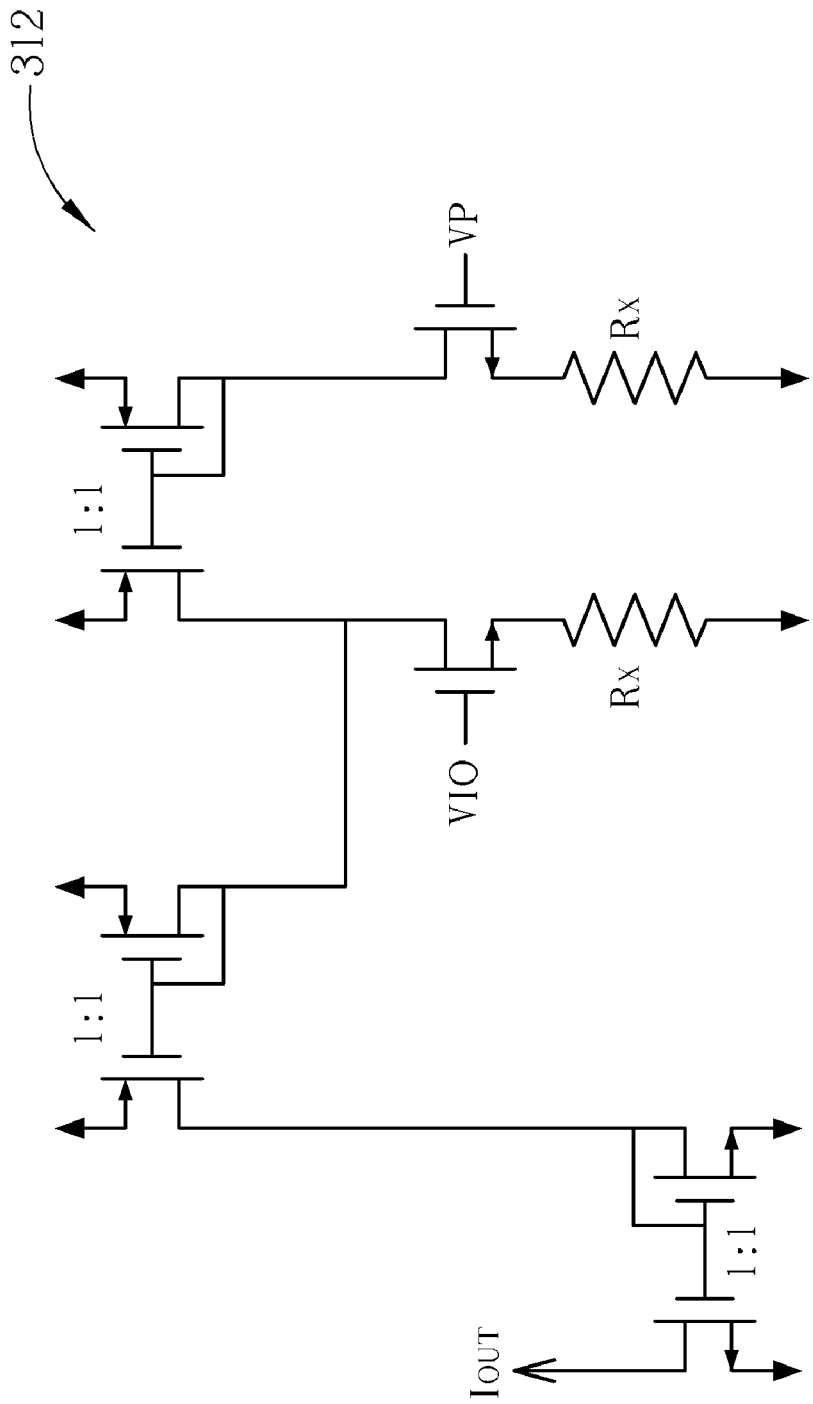
FIG. 5 is a schematic diagram of the feedback circuit shown in FIG. 3 according to a preferred embodiment of the present invention

Note that, the switching amplifier 30 shown in FIG. 3 is an exemplary embodiment of the present invention, and those skilled in the art can make alternations and modifications accordingly. For example, please refer to FIG. 5. FIG. 5 is a schematic diagram of the feedback circuit 312 shown in FIG. 3 according to a preferred embodiment of the present invention. In FIG. 5, the feedback circuit 312 is realized by a subtraction circuit, which is commonly used and understood by those skilled in the art, and is utilized for generating an output current $I_{OUT}=(VIO-VP)/R_X$ according to the integration result VIO and the predetermined value VP. The predetermined value VP can be greater than the value of the reference signal VREF, and the output current $I_{OUT}$ can be utilized for compensating the current flowing to the capacitor 316. In other words, when the integration result VIO is greater than the predetermined value VP, the output current $I_{OUT}$ generated by the feedback circuit 312 is greater than zero, so as to make the current flowing to the capacitor 316 to be zero, and keep stability of the feedback system, namely, to clamp the integration result VIO to the predetermined value VP.

Therefore, in the present invention, when the integration result VIO generated by the integration circuit 308 reaches the predetermined value VP, the switching amplifier 30 can compensate current flowing to the capacitor 316 via the feedback circuit 312, so as to keep stability of the feedback system, and immediately respond to change of the input signal VI, to decrease distortion of the output signal VO.

Figure 6:
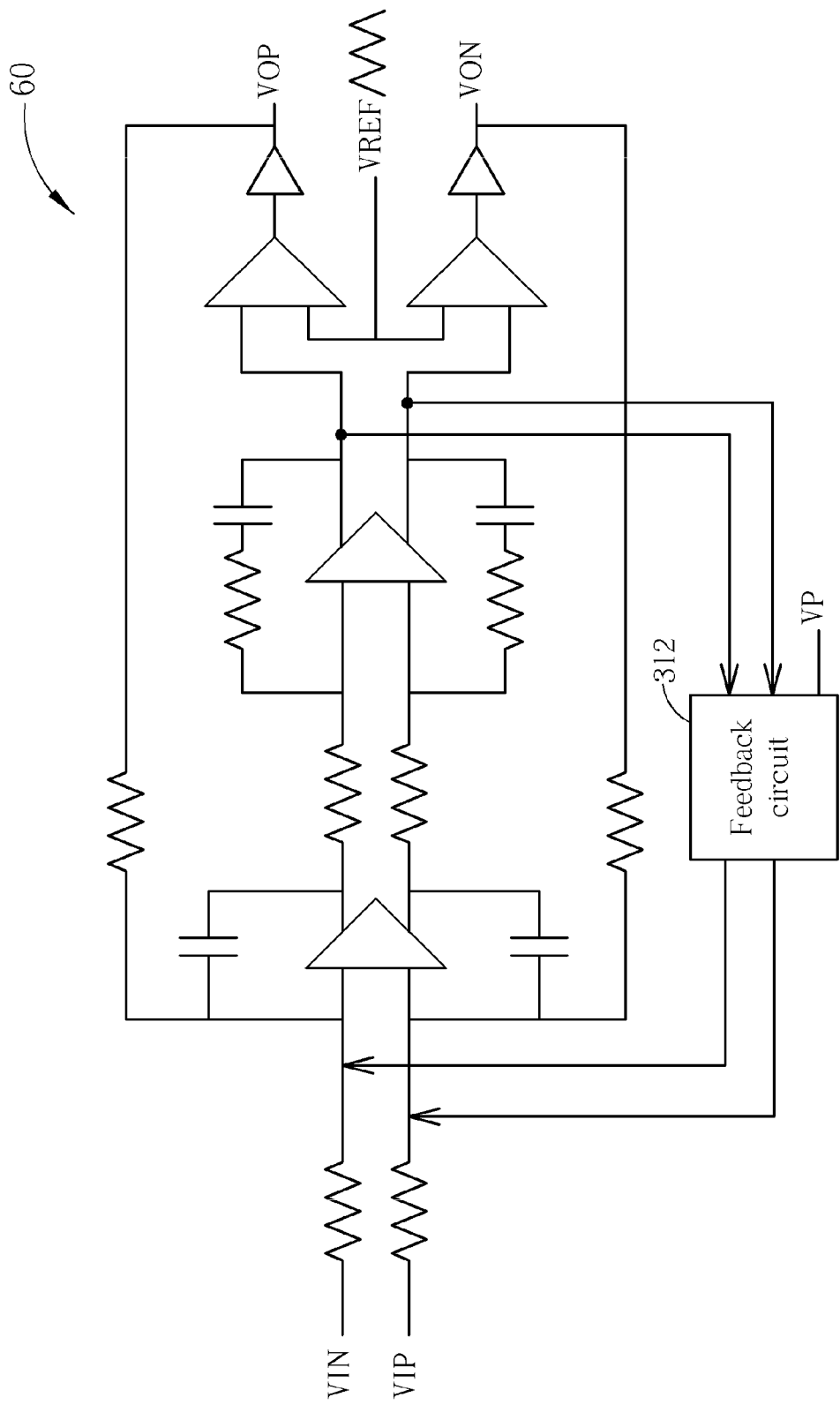
FIG. 6 is a schematic diagram of a differential amplifier according to an embodiment of the present invention.

Moreover, as for differential input and output signals, those skilled in the art can make alternations and modifications according to the amplifier 30. For example, please refer to FIG. 6. FIG. 6 is a schematic diagram of a differential amplifier 60 according to an embodiment of the present invention. The differential amplifier 60 is utilized for amplifying differential input signals VIN, VIP to differential output signals VON, VOP. The structure of the differential amplifier 60 is similar to that of the switching amplifier 30. When one of the differential output levels of integration circuit is greater than a predetermined value, a feedback circuit of the differential amplifier 60 can output a compensating current to keep stability of the feedback system, so as to immediately respond to change of the differential input signals VIN, VIP, and decrease output distortion.

In conclusion, when the output signal is saturated, the present invention can generate compensating current via the feedback circuit to keep stability of the feedback system, so as to immediately respond to the change of the input signal, and decrease output distortion accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching amplifier comprising:
   an input end for receiving an input signal;
   a reference signal reception end for receiving a reference signal;
   a feedback end for receiving a feedback signal;
   an output end for outputting an output signal;
   an integration circuit coupled to the input end, the output end, and the feedback end, for performing integration operation on the input signal according to the output signal and the feedback signal, so as to generate an integration result;
   a comparison circuit coupled to the integration circuit, the reference signal end, and the output end, for comparing the integration result and the reference signal, so as to generate the output signal for the output end; and
   a feedback circuit coupled between an output end of the integration circuit and the feedback end, for generating the feedback signal for the feedback end to clamp the integration result to a predetermined value when the integration result reaches the predetermined value;
   wherein the feedback circuit is utilized for compensating a current of the integration circuit.

2. The switching amplifier of claim 1, wherein the integration circuit is a one-order integration circuit for performing a one-order integration operation on the input signal, so as to generate the integration result.

3. The switching amplifier of claim 1, wherein the integration circuit is a multi-order integration circuit for performing a multi-order integration operation on the input signal, so as to generate the integration result.

4. The switching amplifier of claim 1, wherein the feedback circuit is a subtraction circuit for generating a subtraction result between the integration result and the predetermined value, so as to generate the feedback signal for the feedback end.

5. The switching amplifier of claim 1, wherein the feedback circuit clamps the integration result to the predetermined value when the integration result increases to the predetermined value.

6. The switching amplifier of claim 1, wherein the feedback circuit clamps the integration result to the predetermined value when the integration result decreases to the predetermined value.

7. The switching amplifier of claim 1 further comprising a driving circuit coupled between the output end and the comparison circuit.

8. The switching amplifier of claim 1, wherein the reference signal is a triangle wave signal.

9. The switching amplifier of claim 1 being a differential amplifier.

10. The switching amplifier of claim 9, wherein the input signal, the feedback signal and the output signal are in a differential form.

11. The switching amplifier of claim 9, wherein the comparison circuit comprises a first comparator and a second comparator for comparing the integration result and the reference signal, so as to generate the output signal in a differential form.

* * * * *